United States Patent
Suresh et al.

(12) 
(10) Patent No.: US 6,344,161 B1
(45) Date of Patent: Feb. 5, 2002

(54) DEVICE ENCAPSULATION PROCESS UTILIZING PRE-CUT SLOTS IN FLEXIBLE FILM SUBSTRATE

(75) Inventors: L. K. Suresh, Sunnyvale, CA (US); Kanchit Suphanpeasat, Nonthaburi (TH); Sally Y Foong, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/652,133

(22) Filed: Aug. 31, 2000

Related U.S. Application Data

(60) Provisional application No. 60/215,098, filed on Jun. 29, 2000, now abandoned.

(51) Int. Cl.[7] .......................... B29C 45/14; B29C 70/70
(52) U.S. Cl. .................. 264/156; 264/157; 264/272.15; 264/272.17; 264/274; 438/112; 29/835; 29/841
(58) Field of Search ................................. 264/156, 157, 264/265, 272.15, 272.17, 274; 29/825, 829, 832, 835, 841, 846; 257/676, 711; 438/111, 112, 113, 125, 126

(56) References Cited

U.S. PATENT DOCUMENTS

| | | | | |
|---|---|---|---|---|
| 5,064,706 A | * | 11/1991 | Ueda et al. | 428/131 |
| 5,167,556 A | * | 12/1992 | Stein | 29/841 |
| 5,336,456 A | * | 8/1994 | Eskildsen et al. | 264/274 |
| 5,833,903 A | * | 11/1998 | Centofante | 264/272.17 |
| 5,854,094 A | * | 12/1998 | Fujii et al. | 438/113 |
| 5,854,741 A | * | 12/1998 | Shim et al. | 257/676 |

* cited by examiner

Primary Examiner—Angela Ortiz

(57) ABSTRACT

Segmentation of a flexible, elongated, strip-shaped substrate having a plurality of encapsulated semiconductor devices mounted thereon, for device singulation, is facilitated by pre-cutting pairs of slots through the substrate at each device mounting area, which slots minimize the amount of substrate material required to be removed during device singulation. Disadvantageous penetration of the slots by liquid encapsulant material is substantially prevented, or at least minimized, by forming slots having burrs or flaps at the upper, mounting surface of the substrate which seal off, or substantially reduce the width of the slots.

19 Claims, 2 Drawing Sheets

DEVICE ENCAPSULATION PROCESS UTILIZING PRE-CUT SLOTS IN FLEXIBLE FILM SUBSTRATE

CROSS-REFERENCE TO PROVISIONAL APPLICATION

This application claims priority from U.S. provisional application Ser. No. 60/215,098 filed Jun. 29, 2000, now abandoned, the entire disclosure of which is incorporated herein by reference.

FIELD OF THE INVENTION

The present invention generally relates to an improved method for manufacturing encapsulated semiconductor devices. More specifically, the present invention relates to a method for facilitating singulation or segmentation of a strip-shaped array of encapsulated semiconductor integrated circuit (IC) devices into a plurality of discrete encapsulated IC devices.

BACKGROUND OF THE INVENTION

Semiconductor devices, for example, integrated circuit (IC) devices, are typically fabricated in the form of small, thin, and thus fragile, dies or chips which are electrically connected to a lead frame or other mounting means via a plurality of very fine, fragile wires, and then protected from physical damage, environmentally-induced corrosion or degradation, etc., by means of an encapsulant material which surrounds the die or chip and associated lead frame or mounting. Referring to FIG. 1, which is a schematic plan view of an elongated device mounting strip for illustrating conventional large-scale manufacturing technology, the upper surface 1U of a common substrate 1, e.g., a flexible, elongated strip typically comprised of a polymeric material, e.g., an about 25 to about 150 $\mu$m thick sheet or film of polyimide or other polymer-based flexible tape, includes a plurality of spaced-apart device mounting areas 2 (illustratively from about 4 to about 20 mm wide and from about 4 to about 20 mm long and spaced-apart from about 0.5 to about 3 mm) for mounting thereon a corresponding plurality of IC dies or chips 3, with each mounting area 2 including circuitry (not shown for illustrative simplicity) for providing electrical connection to the die or chip 3 mounted thereat. A plurality of symmetrically opposed pairs of slots 4A, 4B (illustratively from about 0.2 to about 2 mm wide) extending through substrate 1 from the upper surface 1U to the lower surface 1L thereof, with their respective facing termini $4T_A$, $4T_B$ in close proximity (illustratively from about 1 to about 30 mm apart) are formed by cleanly pre-cutting through substrate 1 prior to mounting of die or chip 3, so as to substantially, but not completely, surround a respective device mounting area 2 at the periphery thereof, in order to facilitate segmentation of substrate 1 during singulation of the strip into a plurality of discrete encapsulated devices by reducing, e.g., minimizing, the amount of substrate 1 material to be removed. Referring now to the schematic, cross-sectional view of FIG. 2, to perform encapsulation, a bead 6 of liquid encapsulant, typically comprised of an epoxy-based material, is applied via a dispenser to the spaces 5 between the smaller periphery of each die or chip 3 and the larger periphery of each device mounting area 2, adjacent the inner edge of each of the pairs of slots 4A, 4B. However, in typical practice, the bead 6 of liquid encapsulant disadvantageously flows, aided by surface tension effects, etc., into slots 4A, 4B prior to hardening. Such encapsulant flow (also known as "flashing") necessitates placement of a sheet 7, termed a "coverlay film", on the lower surface 1L of substrate 1 in order to prevent encapsulant 6 which penetrates the substrate from adhering to any underlying mechanical support utilized during curing, transport, etc., thereby adding to process cost and complexity. After encapsulation, the strip is segmented, as by cutting through the substrate to remove the small amount of substrate 1 material between each of the pairs of facing termini $4T_A$, $4T_B$ of each pair of slots 4A, 4B to thereby singulate the array of devices on the common strip into a plurality of discrete, encapsulated IC device packages, wherein the pre-cut pairs of opposing slots 4A, 4B facilitate segmentation by minimizing the amount of substrate 1 material required to be removed by cutting. However, the ease of singulation provided by the pre-cut slots 4A, 4B is either completely lost, or at least diminished, when the latter are filled, or even partially filled, with hardened encapsulant 6, as illustrated in FIG. 2.

Accordingly, there exists a need for improved methodology for reliable manufacture of encapsulated semiconductor devices, e.g., chip- or die-based IC devices, employing pre-cut flexible strip-shaped substrates, which methodology avoids the drawbacks attendant upon fabrication according to the above-described conventional manufacturing processing and effectively addresses and solves problems associated with segmentation of elongated strips of encapsulated semiconductor devices, as by cutting of pre-cut or pre-slotted flexible strips. Further, there exists a need for improved methodology for alleviating the above-described problems yet is fully compatible with the throughput requirements of mass-manufacturing techniques.

The present invention, wherein the pre-cut slots are formed by cutting through the flexible, strip-shaped substrate from the lower surface towards the upper surface thereof in a manner so as to form burrs or flaps which seal off, or at least substantially reduce the width of the slots at the upper surface of the strip, thereby substantially preventing, or at least minimizing, penetration ("flashing") of liquid encapsulant into the slots, effectively addresses and solves the above-described problems attendant upon encapsulation and singulation processing of strip-shaped device arrays. Further, the methodology provided by the present invention provides a significant process simplification by eliminating the need for placement of the "coverlay" sheet 7 over the lower surface 1L of the substrate 1 in order to prevent flow, and adhesion, etc., of the encapsulant 6 to underlying mechanical support surfaces. Finally, the inventive methodology is not limited to use with devices comprising semiconductor IC dies or chips, but rather enjoys diverse utility in the manufacture of all manner of encapsulated electrical devices and components.

DISCLOSURE OF THE INVENTION

An advantage of the present invention is an improved method of making an encapsulated device.

Another advantage of the present invention is an improved method of making an encapsulated semiconductor device utilizing a pre-cut flexible strip substrate.

Yet another advantage of the present invention is an improved method for performing segmentation processing of a strip-shaped array of encapsulated semiconductor devices to singulate the array into a plurality of discrete encapsulated devices.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by a method of manufacturing an encapsulated device, which method comprises the sequential steps of:

(a) providing a substrate including a pair of opposed upper and lower major surfaces;

(b) forming at least one slot extending through the substrate from the upper surface to the lower surface thereof, the at least one slot defining a device mounting area of the upper surface, the at least one slot extending substantially, but not completely, around the periphery of the device mounting area, the forming of the at least one slot comprising cutting the substrate such that burrs or flaps are formed at the upper surface thereof which seal off or at least substantially reduce the width of the at least one slot at the upper surface of the substrate;

(c) positioning a device on the upper surface of the substrate within the device mounting area, the periphery of the device being smaller than the periphery of the device mounting area; and (d) applying a liquid encapsulant material in at least the space between the device periphery and the device mounting area periphery, wherein penetration of the liquid encapsulant into the at least one slot is substantially prevented, or at least minimized, by the presence of the burrs or flaps of the at least one slot at the upper surface of the substrate.

According to embodiments of the present invention, step (a) comprises providing a flexible substrate, e.g., an elongated, strip-shaped, polymer-based substrate; step (b) comprises forming the at least one slot, e.g., a pair of slots arranged in symmetrically opposed relation, by cutting through the substrate in the direction from the lower surface to the upper surface, e.g., by cutting the substrate utilizing a die and punch configured to form a burr or flap at the upper surface of the substrate.

According to further embodiments of the present invention, step (a) comprises providing a substrate including electrical circuitry on the upper surface thereof within the device mounting area; and step (c) comprises positioning an electrical device within the device mounting area and electrically connecting leads extending from the device to the electrical circuitry.

According to still further embodiments of the present invention, step (c) comprises providing a semiconductor device within the device mounting area, e.g., a semiconductor integrated circuit (IC) die or chip; and step (d) comprises applying a liquid encapsulant comprising a polymer-based or polymerizable material, e.g., an epoxy resin based material.

According to yet further embodiments of the present invention:

step (a) comprises providing an elongated, strip-shaped substrate including a plurality of spaced-apart device mounting areas arranged on the upper surface thereof, each mounting area including electrical circuitry;

step (b) comprises forming, for each device mounting area, at least one slot extending through the substrate from the upper surface to the lower surface thereof, the at least one slot substantially, but not completely, surrounding the periphery of the device mounting area, the forming of each slot comprising forming burrs or flaps at the upper surface of the substrate which seal off, or at least substantially reduce the width of each slot at the upper surface;

step (c) comprises positioning an electrical device, e.g., a semiconductor IC die or chip, within each device mounting area and electrically connecting leads extending therefrom to the electrical circuitry of the respective device mounting area; and step (d) comprises applying a liquid encapsulant material, e.g., an epoxy resin-based material, in at least the space between the periphery of each device and the periphery of the respective device mounting area, wherein entry of encapsulant into each of the slots is substantially prevented, or at least minimized by the presence of the burrs or flaps at the upper surface of the substrate.

According to an embodiment of the present invention, the method comprises the further step of:

(e) segmenting the strip-shaped substrate by cutting the substrate in the spaces between adjacent mounting areas to singulate the strip into a plurality of discrete encapsulated devices.

According to another aspect of the present invention, a method of manufacturing at least one encapsulated semiconductor device comprises the sequential steps of:

(a) providing a flexible, elongated, strip-shaped substrate having a pair of opposed upper and lower major surfaces, the substrate including a plurality of spaced-apart device mounting areas arranged on the upper surface, each mounting area including electrical circuitry;

(b) forming, at each device mounting area, a pair of slots extending through the substrate from the upper surface to the lower surface thereof, the slots being arranged in symmetrically opposed relation so as to substantially, but not completely, surround the periphery of the device mounting area, the forming of the pair of slots comprising forming burrs or flaps at the upper surface of the substrate which seal off, or at least substantially reduce the width of each of the slots at the upper surface of the substrate;

(c) positioning a semiconductor device on the upper surface of the substrate within each device mounting area and electrically connecting leads extending therefrom to the electrical circuitry of the respective device mounting area, the periphery of the semiconductor device being smaller than the periphery of the device mounting area; and (d) applying a liquid encapsulant in at least the space between the periphery of each semiconductor device and the periphery of the respective device mounting area, wherein entry of encapsulant into each of the slots is substantially prevented, or at least minimized, by the presence of the burrs or flaps at each of said slots at the upper surface of the substrate.

According to embodiments of the present invention, the method comprises the further step of:

(e) segmenting the strip-shaped substrate by cutting the substrate in the spaces between adjacent device mounting areas to singulate the strip into a plurality of discrete encapsulated semiconductor devices.

According to particular embodiments of the present invention:

step (a) comprises providing a polymer-based substrate;

step (b) comprises forming each pair of slots by cutting through the substrate in the direction from the lower surface to the upper surface thereof utilizing a die and punch configured to form a burr or flap at the upper surface;

step (c) comprises providing a semiconductor device comprising an integrated circuit (IC) die or chip; and step (d) comprise applying a polymer-based or polymerizable material as the liquid encapsulant.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings (not drawn to scale but instead drawn as to best illustrate the drawbacks and features of the prior art and the present invention, respectively), in which like reference numerals are employed throughout to designate similar features, wherein.

DESCRIPTION OF THE INVENTION

The present invention is based upon recognition that pairs of opposing, pre-cut slots in a flexible, strip-shaped substrate utilized for mounting a plurality of encapsulated semiconductor devices thereon can be formed as to be arranged and dimensioned as in conventional manner but provided with burrs or flaps formed at the upper surface of the substrate which seal off or substantially reduce the width of the slots at the upper surface, which burrs or flaps can effectively prevent, or at least minimize, flow of liquid encapsulant thereinto, and thus facilitate segmentation (i.e., singulation) of the substrate into a plurality of discrete encapsulated semiconductor devices. The inventive methodology advantageously maintains the ability to perform segmentation in a facilitated manner by cutting through a minimum amount of substrate material located in the spaces between the proximal, facing ends of each pair of slots, while also dispensing with the need for provision of a coverlay film adjacent the lower surface of the substrate, thereby reducing manufacturing expense and the number of requisite manipulative steps, i.e., affording a significant processing simplification.

Figure 1:
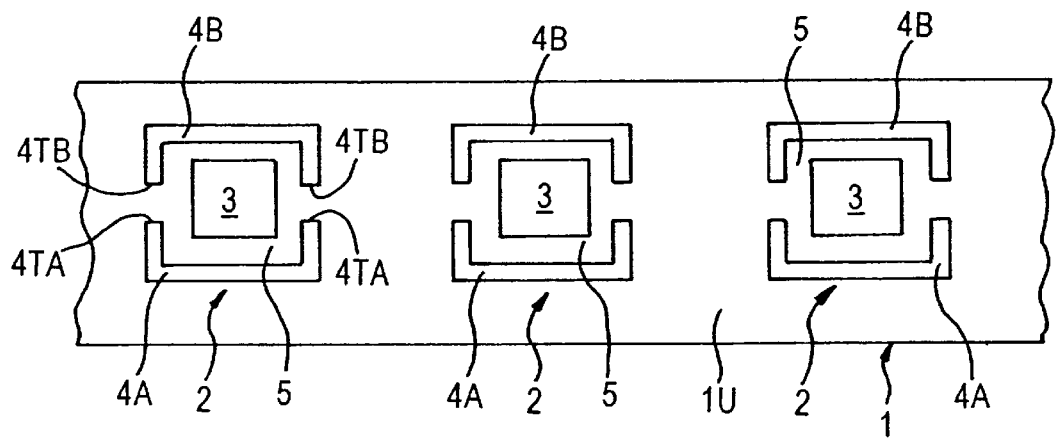
FIGS. 1–2, respectively, are schematic plan and cross-sectional views illustrating conventional manufacturing technology for encapsulation and singulation of a plurality of semiconductor integrated circuit (IC) devices formed on a common, flexible, elongated substrate.
Figure 2:
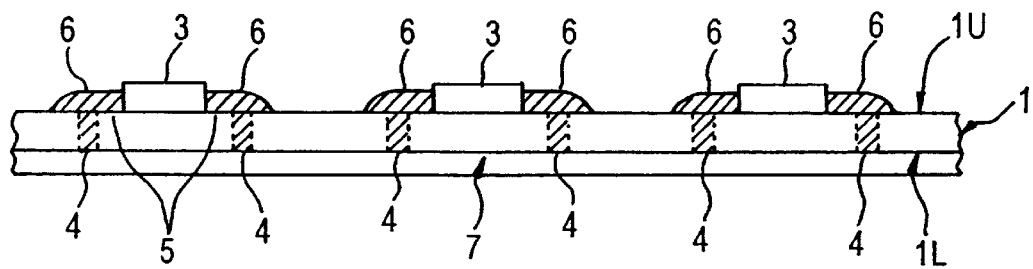
Figure 3:
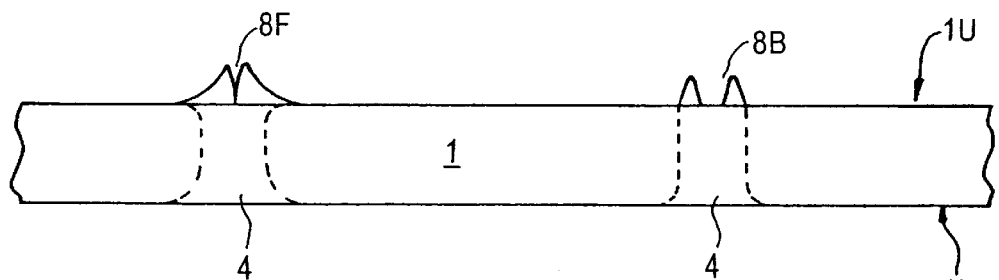
FIG. 3 illustrates, in schematic, cross-sectional view, a flexible, elongated substrate including slots for device singulation formed according to the inventive methodology.

Referring now to FIG. 3, illustrated therein, in an enlarged, schematic, cross-sectional view, is a flexible, elongated substrate 1 including slots 4 for facilitating device singulation, wherein slots 4 are formed to extend through the substrate 1 from the upper surface 1U to the lower surface 1L thereof, slots 4 being conventionally positioned and dimensioned but, however, formed according to the principle of the present invention and including burrs or flaps 8 at the upper surface 1U which effectively seal off, or at least substantially reduce the widths of the slots 4 at substrate upper surface 1U, such that penetration and filling thereof by viscous liquid encapsulant is substantially prevented, or at least minimized.

Burrs or flaps 8 may be formed in the slots 4 at the upper surface 1U of substrate 1 by a variety of techniques, such as by cutting through the substrate 1 in the direction from the lower surface 1L to the upper surface 1U by means of a suitable cutting implement, such as, for example, a die-and-punch means having cutting surfaces specifically configured, e.g., by shaping or partial blunting, to either: (a) not cleanly cut through the substrate, thereby resulting in a ragged edge containing burrs 8B at the exiting surface, i.e., upper surface 1U, which burrs 8B result in a substantial narrowing of the width of slot 4; or (b) result in partial deformation of the substrate 1, i.e., in the vicinity of the slot, whereby the upper (exiting) surfaces 1U are upwardly curved during cutting, and, upon subsequent relaxation of the resilient substrate material after removal of the cutting implement, form flaps 8F which effectively seal off the slots 4 at the upper surface 1U of the substrate 1. In either instance, entry and penetration of viscous liquid encapsulant 6 into the slots 4 via the upper surface 1U of the substrate 1 is substantially prevented, or at least minimized by the presence of burrs 8B or flaps 8F which close off or reduce the width thereof.

Figure 4:
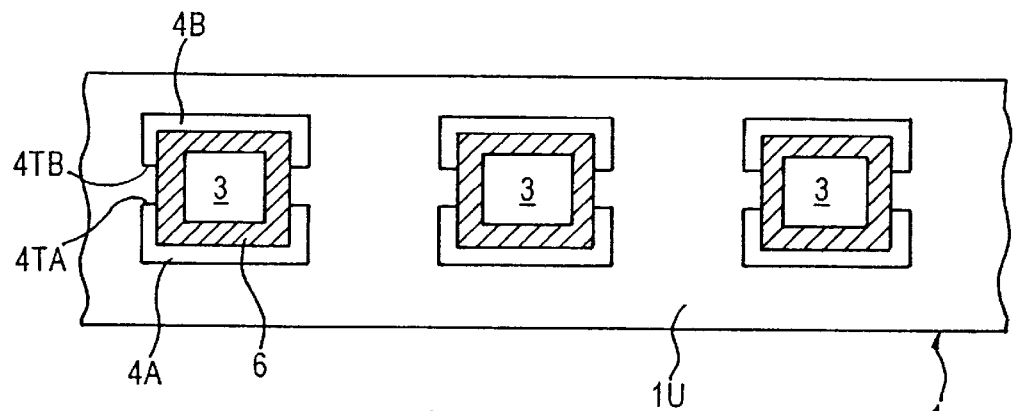
FIGS. 4–5, respectively, are schematic plan and cross-sectional views illustrating encapsulation and singulation processing of a plurality of IC devices formed on a common, flexible, elongated substrate, according to the inventive methodology.
Figure 5:
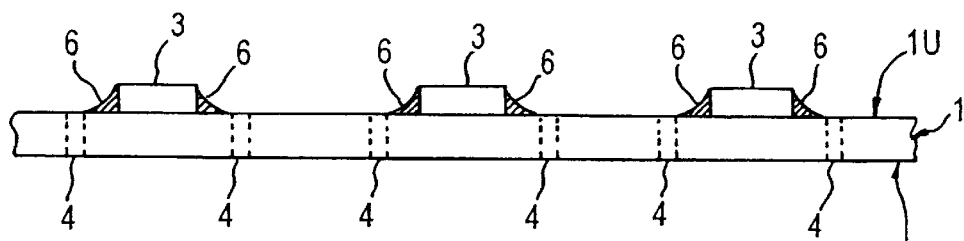

Adverting to FIGS. 4–5, a bead 6 of polymer-based or polymerizable, viscous liquid encapsulant, typically an epoxy resin-based material, is applied to each of the device mounting areas 2 at least in the space 5 between the inner periphery of each pair of opposed slots 4A, 4B and the outer periphery of the IC die or chip 3, so as to surround and encapsulate the latter. As is evident from FIGS. 4–5, according to the invention, slots 4 remain substantially free of encapsulant 6 and thus segmentation of substrate 1 for encapsulated device singulation is unhindered, i.e., the unfilled slots 4 facilitate segmentation by limiting the amount of substrate 1 material required to be removed by cutting to that located between the respective facing termini $4T_A$ and $4T_B$ of slots 4. In addition, since penetration of encapsulant 6 through slots 4 to the lower surface 1L of the substrate 1 is effectively prevented according to the inventive methodology, provision of a coverlay sheet 7, such as is necessary when performing encapsulation processing according to the conventional art, is not required, thereby reducing fabrication expense and resulting in a significant process simplification.

A number of advantages over the conventional encapsulation/singulation processing utilizing the cleanly-cut slots 4 of the conventional art are thus provided by use of the inventive methodology, wherein the slots 4 are not cleanly cut through the substrate 1, but rather are sealed off or reduced in width at the substrate upper surface so as to prevent or at least reduce encapsulant penetration thereinto, including, inter alia, maintenance of ease of device singulation provided by the slots, and elimination of any need for provision of a coverlay sheet. Further, the inventive methodology is fully compatible with the throughput requirements of automated semiconductor device manufacture and the inventive principle as expressed herein is not limited to use with IC dies or chips, but rather is applicable to performing rapid and reliable encapsulation and singulation of all manner of electrical and electronic components and devices.

In the previous description, numerous specific details have been set forth, such as specific materials, structures, processes, etc., in order to provide a better understanding of the present invention. However, the present invention can be practiced without resorting to the details specifically set forth. In other instances, well-known processing techniques, structures, and implements have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible of changes and/or modifications within the scope of the inventive concept as expressed herein.

What is claimed is:

1. A method of manufacturing an encapsulated device, comprising the sequential steps of:
    (a) providing a substrate including a pair of opposed upper and lower major surfaces;
    (b) forming at least one slot extending through said substrate from said upper surface to said lower surface thereof, said at least one slot defining a device mounting area of said upper surface, said at least one slot extending substantially, but not completely, around the periphery of said device mounting area, said forming of said at least one slot comprising cutting said substrate such that burrs or flaps are formed at said upper surface thereof which seal off or at least substantially reduce the width of said at least one slot at said upper surface of said substrate;
    (c) positioning a said device on said upper surface of said substrate within said device mounting area, the periphery of said device being smaller than said periphery of said device mounting area; and
    (d) applying a liquid encapsulant material in at least the space between said device periphery and said device mounting area periphery, wherein penetration of said liquid encapsulant into said at least one slot is substantially prevented, or at least minimized, by the presence of said burrs or flaps of said at least one slot at said upper surface of said substrate.

2. The method according to claim 1, wherein:
step (a) comprises providing a flexible substrate.

3. The method according to claim 2, wherein:
step (a) comprises providing an elongated, strip-shaped substrate.

4. The method according to claim 3, wherein:
step (a) comprises providing a polymer-based substrate.

5. The method according to claim 2, wherein:
step (b) comprises forming said at least one slot by cutting through said substrate in the direction from said lower surface to said upper surface.

6. The method according to claim 5, wherein:
step (b) comprises cutting said substrate utilizing a die and punch configured to form a burr or flap at said upper surface of said substrate.

7. The method according to claim 5, wherein:
step (b) comprises forming a pair of slots arranged in symmetrically opposed relation.

8. The method according to claim 2, wherein:
    step (a) comprises providing a substrate including electrical circuitry on said upper surface thereof within said device mounting area; and
    step (c) comprises positioning an electrical device within said device mounting area and electrically connecting leads extending from said electrical device to said electrical circuitry.

9. The method according to claim 8, wherein:
step (c) comprises positioning a semiconductor device within said device mounting area.

10. The method according to claim 9, wherein:
step (c) comprises positioning a semiconductor integrated circuit (IC) die or chip within said device mounting area.

11. The method according to claim 8, wherein:
step (d) comprises applying a liquid encapsulant comprising a polymer-based or polymerizable material.

12. The method according to claim 11, wherein:
step (d) comprises applying a liquid encapsulant comprising an epoxy resin-based material.

13. The method according to claim 8, wherein:
    step (a) comprises providing an elongated, strip-shaped substrate including a plurality of spaced-apart device mounting areas arranged on said upper surface thereof, each said device mounting area including electrical circuitry;
    step (b) comprises forming, for each device mounting area, at least one said slot extending through said substrate from said upper surface to said lower surface thereof, said at least one slot substantially, but not completely, surrounding said periphery of said device mounting area, said forming of each slot comprising forming burrs or flaps at said upper surface of said substrate which seal off, or at least substantially reduce the width of each slot at said upper surface;
    step (c) comprises positioning an electrical device within each said device mounting area and electrically connecting leads extending therefrom to the electrical circuitry of the respective device mounting area; and
    step (d) comprises applying a liquid encapsulant material in at least the space between the periphery of each device and the periphery of the respective device mounting area, wherein entry of encapsulant into each of said slots is substantially prevented, or at least minimized, by the presence of said burrs or flaps at said upper surface of said substrate.

14. The method according to claim 13, wherein:
step (c) comprises positioning a semiconductor IC die or chip within each device mounting area.

15. The method according to claim 14, wherein:
step (d) comprises applying a liquid encapsulant comprising an epoxy resin-based material.

16. The method according to claim 13, further comprising the step of:
    (e) segmenting said strip-shaped substrate by cutting through said substrate in the spaces between adjacent device mounting areas to singulate said strip into a plurality of discrete encapsulated devices.

17. A method of manufacturing at least one encapsulated semiconductor device, comprising the sequential steps of:
    (a) providing a flexible, elongated, strip-shaped substrate having a pair of opposed upper and lower major surfaces, said substrate including a plurality of spaced-apart device mounting areas, each said mounting area including electrical circuitry arranged on said upper surface;

(b) forming, at each spaced-apart device mounting area, a pair of slots extending through said substrate from said upper surface to said lower surface thereof, said slots being arranged in symmetrically opposed relation so as to substantially, but not completely, surround the periphery of the device mounting area, said forming of said pair of slots comprising forming burrs or flaps at said upper surface of said substrate which seal off, or at least substantially reduce the width of each of said slots at said upper surface of said substrate;

(c) positioning a semiconductor device on said upper surface of said substrate within each said device mounting area and electrically connecting leads extending therefrom to the electrical circuitry of the respective device mounting area, the periphery of said semiconductor device being smaller than the periphery of said device mounting area; and (d) applying a liquid encapsulant in at least the space between the periphery of each semiconductor device and the periphery of the respective device mounting area, wherein entry of encapsulant into each of said slots is substantially prevented, or at least minimized, by the presence of said burrs or flaps of each of said slots at said upper surface of said substrate.

18. The method according to claim 17, comprising the further step of:

(e) segmenting said strip-shaped substrate by cutting through said substrate in the spaces between adjacent device mounting areas to singulate said strip into a plurality of discrete encapsulated semiconductor devices.

19. The method according to claim 17, wherein:

step (a) comprises providing a polymer-based substrate;

step (b) comprises forming each pair of slots by cutting through said substrate in the direction from said lower surface to said upper surface thereof utilizing a die and punch configured to form a said burr or flap at said upper surface;

step (c) comprises providing a semiconductor device comprising a integrated circuit (IC) die or chip; and step (d) comprises applying a polymer-based or polymerizable material as said liquid encapsulant.

* * * * *